United States Patent
Hoshiya et al.

(10) Patent No.: US 6,690,163 B1
(45) Date of Patent: Feb. 10, 2004

(54) MAGNETIC SENSOR (75) Inventors: Hiroyuki Hoshiya, Hitachi (JP);
Katsuro Watanabe, Kanasago (JP);
Yasunari Tajima, Ninomiya (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/489,024

(22) Filed: Jan. 21, 2000

(30) Foreign Application Priority Data

Jan. 25, 1999 (JP) .......................................... 11-015251

(51) Int. Cl.$^7$ ........................... G11B 5/00; G01R 33/02; H03L 43/08
(52) U.S. Cl. ...................... 324/252; 338/32 R; 428/692
(58) Field of Search ...................... 324/252; 338/32 R; 428/692; 360/324, 324.1, 324.11, 324.12

(56) References Cited

U.S. PATENT DOCUMENTS

| 4,663,607 A | 5/1987 | Kitada et al. |
| 4,949,039 A | 8/1990 | Grunberg |
| 5,408,377 A | 4/1995 | Gurney et al. |
| 5,422,571 A | 6/1995 | Gurney et al. |
| 5,598,308 A | 1/1997 | Dieny et al. |
| 5,731,936 A | 3/1998 | Lee et al. |
| 6,301,088 B1 * | 10/2001 | Nakada .................. 360/324.11 |

FOREIGN PATENT DOCUMENTS

| JP | 2-61572 | 3/1990 |
| JP | 5-37358 | 6/1993 |
| JP | 5-266436 | 10/1993 |
| JP | 6-236527 | 8/1994 |
| JP | 06-325934 | 11/1994 |
| JP | 07-078313 | 3/1995 |
| JP | 09-138919 | 5/1997 |
| JP | 10-198926 | 7/1998 |
| JP | 11-039612 | 2/1999 |

OTHER PUBLICATIONS

S.S.P. Parkin, "Dramatic Enhancement of Interlayer Exchange Coupling and Giant Magnetoresistance in Ni18Fe19/Cu Multilayers by Addition of Thin Co Interface Layers", Applied Physics Letters, vol. 61, No. 11, Sep. 1992, pp. 1358–1360.

* cited by examiner

Primary Examiner—Walter E. Snow
(74) Attorney, Agent, or Firm—Mattingly, Stanger & Malur, P.C.

(57) ABSTRACT

To provide a spin-valve magnetic head comprising a layered film having preferable magnetic properties in which an interface control film to reduce magnetostriction to almost zero is inserted.

By suppressing or offsetting the influence of an interface layer which increases the magnetostriction of a soft magnetic free layer in a spin-valve magnetoresistive layered film and making the magnetic properties of the very thin soft magnetic free layer preferable, a stable magnetic head of high sensitivity which is not influenced by stress is obtained by the improvement in the magnetic properties of the very thin soft magnetic free layer.

3 Claims, 12 Drawing Sheets

MAGNETIC SENSOR

BACKGROUND OF THE INVENTION

The present invention relates to a magnetic recording and reproducing device and a magnetoresistive device and, more particularly, to a high recording density magnetic recording and reproducing device.

Japanese Unexamined Patent Publication No. Hei 2-61572 discloses a stack layer whose electric resistivity is changed according to an angle of magnetizations of ferromagnetic thin layers separated via an intermediate layer, a magnetic field sensor and a magnetic recording device each using the stack layer, and an iron-manganese alloy thin film.

Japanese Patent Application No. Hei 9-189454 (Japanese Unexamined Patent Publication No. Hei 11-39612) discloses a magnetoresistive device in which a barrier layer is provided between an underlayer made of Ta or the like and a magnetic layer made of NiFe or the like.

Japanese Unexamined Patent Publication No. Hei 6-325934 discloses a spin valve device using a ferromagnetic film made of Co, Ni, Fe, or especially CoFe whose closest packed plane face is oriented perpendicular to the surface.

U.S. Pat. No. 5,408,377 discloses a magnetoresistive device having a free layer consisting of two NiFe layers which are separated by an Ru film.

Japanese Patent Application No. Hei 5-223277 (Japanese Unexamined Patent Publication No. Hei 7-78313) discloses a spin valve layer having a structure of an antiferromagnetic film/a first magnetic film/a nonmagnetic film/a second magnetic film, in which the second magnetic film is a stack layer of Co alloy and Ni alloy, and a magnetic recording and reproducing device.

Japanese Unexamined Patent Publication No. Hei 5-266436 discloses a magnetoresistive sensor having a tri-layer of a first ferromagnetic material thin film layer, a third nonmagnetic metal material thin film layer, and a second ferromagnetic material thin film layer, in which a fourth material thin film layer is disposed in the first ferromagnetic material thin film, on the interface between the first ferromagnetic material thin film layer and the third nonmagnetic metal material thin layer or in a position apart from the interface.

In "Applied Physics letter", Vol. 61, 1992, pp. 1358–1360, an NiFe/Cu multilayer in which a thin Co layer is inserted on the interface is described.

Japanese Unexamined Patent Publication No. Hei 6-236527 discloses a spin valve magnetoresistive sensor in which a back layer made of a nonmagnetic conductive material is stacked to a ferromagnetic layer.

U.S. Pat. No. 5,731,936 discloses a magnetoresistive device using an NiFe film in which an NiCr layer and an NiFeCr layer are stacked.

Japanese Unexamined Patent Publication No. Hei 9-138919 discloses a magnetoresistive magnetic head in which the value of a magnetostriction constant is controlled by adding Au, Pt, or Pd to an NiFe alloy film.

Japanese Patent Application No. Hei 9-1140 (Japanese Unexamined Patent Publication No. Hei 10-198926) discloses a magnetoresistive magnetic head in which the absolute value of a magnetostriction is controlled by stacking a film having a proper magnetostriction on a magnetic film.

Japanese Examined Patent Publication No. Hei 5-37358 discloses a magnetoresistive device in which a magnetoresistive film of positive magnetostriction and a magnetoresistive film of negative magnetostriction are alternately stacked.

According to the conventional techniques, a magnetic recording device of sufficiently high recording density and, especially, a magnetoresistive device, as a reproducing unit of the magnetic recording device, which operates with sufficient sensitivity to an external magnetic field and an output cannot be realized. Further, preferable characteristics such that stability of an output is sufficiently controlled cannot be obtained, and it is difficult to realize the function of a storage.

In recent years, it is known that the magnetoresistive effect of a multilayer in which ferromagnetic metal layers are stacked via a nonmagnetic metal layer, what is called a giant magnetoresistance, is large. In this case, in the magnetoresistive effect, electric resistivity changes according to an angle between the magnetizations of the ferromagnetic layers which are separated by the nonmagnetic layer. When the giant magnetoresistive effect is used for a magnetoresistive device, a structure called a spin-valve is proposed.

Specifically, in the structure of ferromagnetic layer/nonmagnetic layer/soft magnetic layer, the magnetization of the soft magnetic layer rotates by an external magnetic field with respect to the ferromagnetic layer whose magnetization is substantially pinned within a range of the magnetic field to be sensed. Consequently, the electric resistivity changes according to a relative magnetization angle difference and an output can be obtained.

In order to pin the magnetization of the ferromagnetic layer, closely attached antiferromagnetic layer, which generated an exchange coupling field on the ferromagnetic layer in the interface between the ferromagnetic layer and the antiferromagnetic layer is employed. Also, a magnetic film having a large coercive force and a large remained magnetization is employed.

The effect of pinning will be called a pinned bias and the antiferromagnetic film producing the effect will be called a pinned bias film. The ferromagnetic layer whose magnetization is substantially pinned will be called a ferromagnetic pinned layer. Similarly, a soft magnetic film whose magnetization rotates by an external magnetic field will be called a free layer or a soft magnetic free layer.

As described above, the structure of applying a giant magnetoresistive effect and applying a spin valve magnetoresistive stack layer to a magnetic head adapted to high density recording is desirable. The direction of magnetization to be sensed will be called a transverse direction and a direction which is almost perpendicular to the transverse direction and is parallel to the film surface of the magnetoresistive stack film will be called a longitudinal direction. In the case of using it in a magnetic head, generally, the transverse direction is called a device height direction and the longitudinal direction is called a track width direction. Generally, in order to apply a current to the magnetoresistive stack film, a pair of electrodes are disposed in the track width direction and a change in resistance caused by the magnetoresistive effect is detected.

The magnetization state with a zero magnetic field of the ferromagnetic pinned layer has to be in the transverse direction and that of the soft magnetic free layer has to be in the longitudinal direction in a driving state so that the spin valve device has a preferable symmetry as a magnetic sensor. Because of the property that the magnetization of the ferromagnetic pinned layer is pinned, it can be considered that the magnetization of the ferromagnetic pinned layer is relatively directed in the transverse direction.

It is, however, difficult to direct the magnetization of the soft magnetic free layer strictly in the longitudinal direction due to its property that it is rotatable. In the case where the magnetization of the soft magnetic free layer is not strictly in the longitudinal direction, an output of the magnetoresistive device becomes asymmetrical for the positive and negative magnetic fields to be sensed and, simultaneously, an output becomes unstable. The factors related to the stability of the magnetoresistive device are, simply speaking, the magnetic properties of the soft magnetic free layer itself, especially, the magnitude and direction of anisotropy, coercive force, and magnetostriction. In the case where the magnetostriction of the soft magnetic free layer is not zero, when the substrate is distorted, anisotropy induced by stress occurs in the soft magnetic free layer by a reverse magnetoelasticity effect and the direction of magnetization is changed.

One of means to increase the recording density of the magnetic recording is a method of improving the sensitivity to the external magnetic field of the device by reducing the amount of the magnetization of the soft magnetic free layer. A problem especially in such a case is that the magnetic properties of the soft magnetic free layer deteriorate as the film becomes thinner. Specifically, when the sensitivity of the magnetoresistive device is increased to raise the recording density, it becomes difficult to maintain the properties of the soft magnetic free layer preferable and, as a result, the stability of the reproducing device deteriorates. In order to solve the problem, a method of improving the magnetic properties and suppressing the magnetostriction by stacking another magnetic layer on or under the soft magnetic free layer is proposed.

SUMMARY OF THE INVENTION

It is an object of the invention to provide a magnetoresistive magnetic sensor and a magnetic recording device adapted to high density recording and, more particularly, to provide a spin valve magnetic sensor having a soft magnetic free layer using a magnetostriction control structure or a magnetostriction control film and a magnetic head and a magnetic recording and reproducing device each using the spin-valve magnetic sensor.

In the invention, as means adapted to high recording density, a magnetic recording device in which a magnetic sensor using a giant magnetoresistive effect is mounted on a magnetic head is employed. As the magnetic sensor, a magnetoresistive device comprising a spin-valve giant magnetoresistive film having a layered structure of soft magnetic free layer/nonmagnetic conductive layer/ferromagnetic pinned layer/antiferromagnetic film is used. The spin-valve giant magnetoresistive film has the layered structure of soft magnetic free layer/nonmagnetic intermediate layer/ferromagnetic pinned layer/antiferromagnetic film and is characterized in that the antiferromagnetic layer applies an exchange coupling magnetic field to the ferromagnetic pinned layer, the magnetization of the soft magnetic free layer rotates according to an external magnetic field, and the relative angle between the magnetization of the soft magnetic free layer and the magnetization of the ferromagnetic pinned layer is changed, thereby producing a magnetoresistive effect.

The subject of the invention is to make the soft magnetic free layer in the magnetoresistive device thinner and to stabilize the magnetic properties. As means to achieve the subject, according to the invention, first, an interface layer for controlling magnetostriction is stacked on the interface of the soft magnetic free layer in the magnetoresistive device. The face on which the interface layer is stacked is the interface opposite to the face on which the soft magnetic free layer is in contact with the nonmagnetic conductive layer. The magnetostriction control film also serves as a diffusion preventing layer for preventing flow of harmful elements from the other layer to the soft magnetic free layer. The diffusion preventing layer may be provided separately from the magnetostriction control film. When the soft magnetic free layer takes the form of a stack member of magnetic films which are different from each other, it is desirable to apply the diffusion/mixture preventing layer on the interface between the magnetic films.

That is, the object of the invention is to realize the structure for suppressing the diffusion from the other film in contact with the interface of the soft magnetic free layer or suppressing the diffusion at the interface of the soft magnetic free layer itself in order to allow the soft magnetic free layer to hold the preferable magnetic properties and a proper magnetostriction value. Another object of the invention is to dispose a film which adjusts elements diffused and flowed through the interface into the soft magnetic free layer to thereby cancel a change in the magnetic properties on the interface of the soft magnetic free layer.

With the structure, by using the magnetostriction control film substantially having no spontaneous magnetization at room temperature, also effects such that an influence is exerted on the soft magnetic free layer disposed via the interface, the value of magnetostriction is made proper, the coercive force is reduced, and the value and the direction of an anisotropic magnetic field are held properly can be produced. Alternatively, by eliminating the influence of diffusing elements flowing in through the interface, preferable inherent properties of the soft magnetic free layer can be held. By mounting the magnetic sensor using the stack film in which the magnetic properties of the soft magnetic free layer are improved by using the means as mentioned above, the magnetic head and the magnetic recording and reproducing device having a preferable output and stability can be obtained.

As another solving means, an interface control layer for preventing mixture and diffusion is inserted between an Ni alloy layer and a Co layer constructing the soft magnetic free layer. The material and the thickness of the interface control layer are selected so as to suppress increase in the magnetostriction caused by the mixture of Ni and Co and so as not to deteriorate the magnetic connection between the Ni alloy layer and the Co layer and transmittance of electrons to generate magnetic resistance.

It is noted here that, although each of the interface control layer, the magnetostriction control layer, and the mixture/diffusion preventing layer is described as a layer, it denotes a process of forming each of them as a layer when the stack film is formed. Even when each of the layers is not a complete continuous layer or diffusion or mixture occurs with the neighboring layer, the function is not lost at all. Rather, the mutual action with the neighboring soft magnetic free layer is also desirable.

DETAILED DESCRIPTION OF THE PREFERRED EMBODIMENTS

A film constructing each of a magnetic stack member, a magnetic recording medium, and a RF magnetoresistive device of the invention is fabricated by an R magnetron sputtering system as follows. The following materials are sequentially stacked on a ceramics substrate having a thickness of 1 mm and a diameter of 3 inches in an atmosphere of 6 millitorr of argon. As sputtering targets, tantalum, nickel-20 at % iron alloy, copper, cobalt in which iron chips are arranged, and chromium-50 at % manganese in which platinum chips are arranged are used. The composition is adjusted by arranging chips of an additive element such as chromium, platinum, or copper on a nickel target.

A layered film is fabricated by generating a plasma within the system by applying an RF power to each cathode on which a target is disposed and sequentially forming layers by opening/closing shutters each disposed for each cathode one by one. At the time of forming a film, a magnetic field of about 80 oersted is applied in parallel to the substrate by using a permanent magnet to obtain uniaxial anisotropy and the direction of an exchange coupling field of a chromium-manganese film or the like is induced to each direction. Devices on the substrate are fabricated by patterning in a photoresist process. After that, the substrate is slider processed and mounted on a magnetic recording device.

Concrete embodiments of the invention will be described hereinbelow with reference to the drawings.

Figure 1:
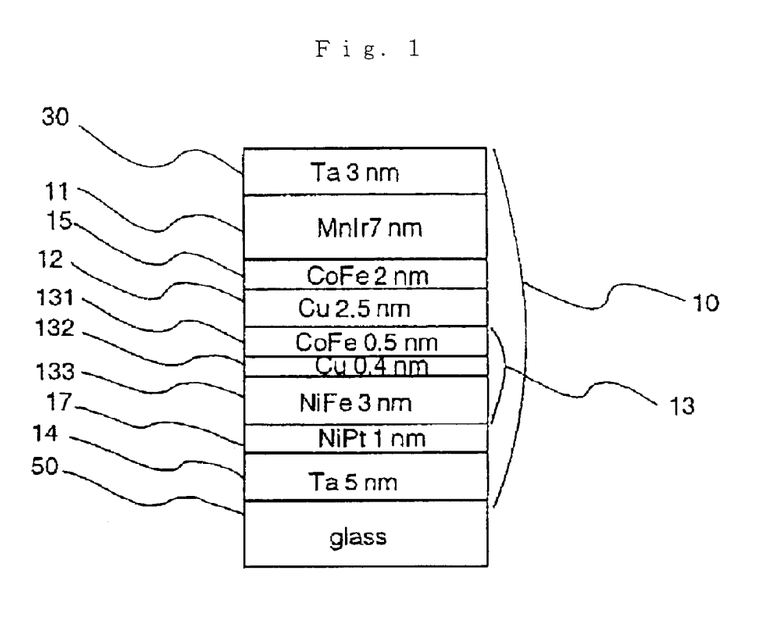
FIG. 1 is a diagram showing a first configuration example of a magnetoresistive layered film of the invention.

FIG. 1 is a diagram showing a layered structure of a magnetoresistive layered film of a magnetic sensor of the invention. A magnetoresistive layered film 10 is obtained by stacking an underlayer 14, an interface control film 17, a soft magnetic free layer 13, a nonmagnetic intermediate layer 12, a ferromagnetic pinned layer 15, an antiferromagnetic film 11, and a protection film 30 on a substrate 50. The antiferromagnetic film 11 applies unidirectional anisotropy to the ferromagnetic pinned layer 15 by exchange coupling to thereby stably pin the residual magnetization of the ferromagnetic pinned layer 15 within a range of a magnetic field to be sensed. The soft magnetic free layer 13 consists of an Ni alloy layer 133, an interface control layer 132, and a Co layer 131. It is desirable that the Ni alloy layer 133 has a composition of almost zero magnetostriction when the film is thick. For example, it is made of Ni-19 at % Fe. The interface control layer 132 is formed as extremely thin as 1 nanometer or less. The Ni alloy layer 133 and the Co layer 131 are magnetically integrated.

A material which does not easily form a crystal structure or magnetic structure is selected as a material of the interface control layer 132 so as not to attenuate the magnetoresistive effect. For example, Cu is preferable. Although there are cases such that the part of the interface control layer 132 is not a substantially continuous layer or a layer which is mixed with or diffused to the adjacent Ni alloy layer 133 and Co layer 131, there is no problem with the functions. The interface control layer 132 has the functions of forming a mixing or diffusing area with the direct interface with each of the Ni alloy layer 133 and the Co layer 131 and preventing deterioration in the magnetic properties such as magnetostriction. Similarly, the interface control layer 17 has the functions of preventing mutual action caused by the mixture or diffusion between the under layer 14 and the soft magnetic free layer 13 and preventing the magnetic properties such as magnetostriction from deteriorating.

It is desirable that the interface control layer 17 does not substantially have spontaneous magnetization at an operating temperature or, even when it has spontaneous magnetization, the magnetization is small enough not to exert an influence. As a reference, 0.6 tesla or less which is the magnetization of Ni is desirable. Preferably, a material which does not exert any magnetic influence of increasing the magnetostriction on the adjacent soft magnetic free layer 13 or produces an effect of reducing the magnetostriction is used as the material of the interface control layer 17. For example, it is preferable that a large amount of precious metal such as Pt or Ni is contained. On the other hand, the interface control layer 17 is positioned on the substrate side more than the other layers and serves as a seed to determine the crystal property of the other layers. Consequently, a material which shows preferable orientation or crystal grain growth on the underlayer 14, such as a Ni metal, a precious metal of a face-centered cubic crystal or hexagonal close-packed crystal, or an alloy of any of the above materials is preferable.

Figure 2:
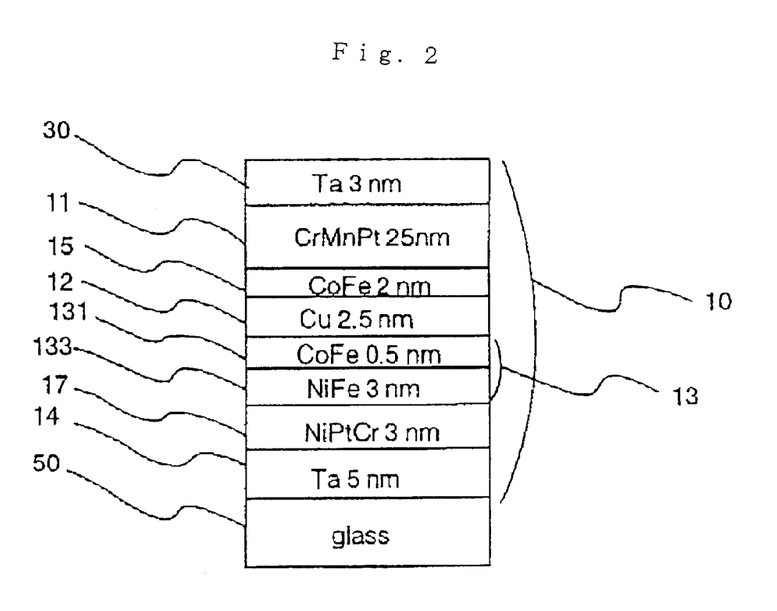
FIG. 2 is a diagram showing a second configuration example of the magnetoresistive layered film of the invention.

FIG. 2 is a diagram showing another stack structure of the magnetoresistive layered film of a magnetic sensor of the invention. The magnetoresistive layered film 10 is obtained by stacking the underlayer 14, the interface control film 17, the soft magnetic free layer 13, the nonmagnetic intermediate layer 12, the ferromagnetic pinned layer 15, the antiferromagnetic film 11, and the protection film 30 on the substrate 50. The soft magnetic free layer 13 consists of the Ni alloy layer 133 and the Co layer 133. It is desirable that the Ni alloy layer 133 has a composition such that the magnetostriction is slightly reduced when the film is thick. For example, Ni-16 at % Fe is desirable. The interface control film 17 is made of a material having a Ni—Cr based composition in which the electric resistivity is increased to 60 $\mu\Omega$cm. The magnetic resistance of the stack film is therefore increased. The other functions are almost the same as those in the case of the structure shown in FIG. 1.

Figure 3:
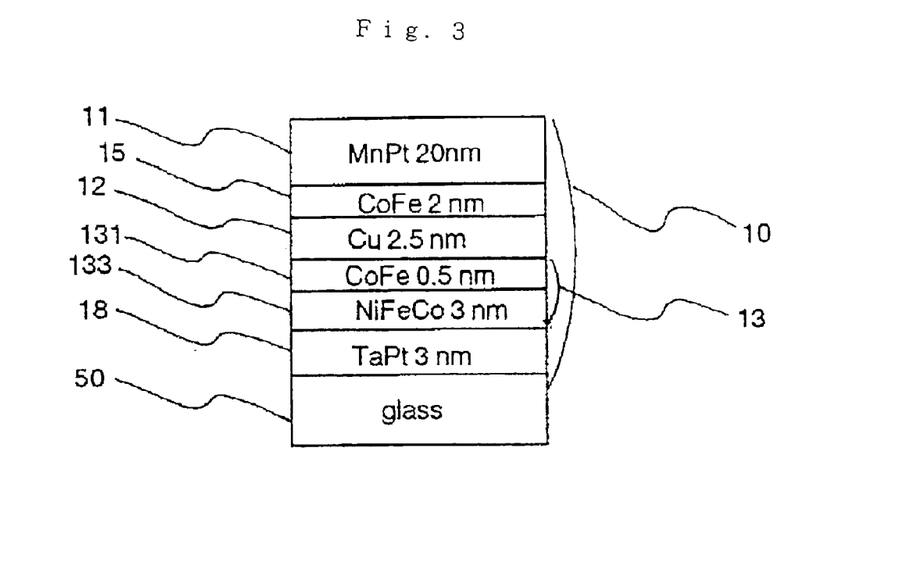
FIG. 3 is a diagram showing a third configuration example of the magnetoresistive layered film of the invention.

FIG. 3 is a diagram showing further another layered structure of the magnetoresistive layered film of the magnetic sensor of the invention. The magnetoresistive layered film 10 is obtained by stacking an interface control underlayer 18, the soft magnetic free layer 13, the nonmagnetic intermediate layer 12, the ferromagnetic pinned layer 15, and the antiferromagnetic film 11 on the substrate 50. The soft magnetic free layer 13 consists of the Ni alloy layer 133 and the Co layer 131. The interface control underlayer 18 has both of the function of an underlayer and the function of an interface control layer. It is made of a material having an effect of not exerting a magnetic influence of increasing the magnetostriction on the adjacent soft magnetic free layer 13 or a material having an effect of reducing it. For example, it is preferable that a large amount of a precious metal such as Pt or Ni is contained.

On the other hand, the interface control underlayer 18 is positioned on the substrate side more than the other layers and serves as a seed to determine the crystal property of the other layers. Consequently, a material by which other layers show preferable orientation or crystal grain growth such as a high melting temperature metal which has a face-centered cubic structure, hexagonal close-packed crystal, amorphous, a crystallite or an alloy of any of the above materials is preferable. The other functions are almost similar to those of the cases of the structures shown in FIGS. 1 and 2.

Figure 4:
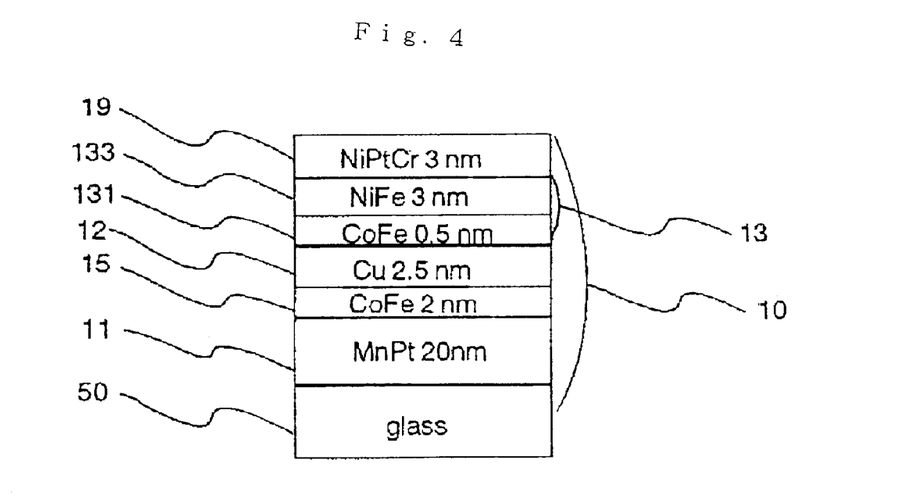
FIG. 4 is a diagram showing a fourth configuration example of the magnetoresistive layered film of the invention.

FIG. 4 is a diagram showing further another stack structure of the magnetoresistive layered film of a magnetic sensor of the invention. The magnetoresistive layered film 10 is obtained by stacking the antiferromagnetic film 11, the ferromagnetic pinned layer 15, the nonmagnetic intermediate layer 12, the soft magnetic free layer 13, and an interface control protection film 19 on the substrate 50. The soft magnetic free layer 13 consists of the Co base layer 131 and the Ni base layer 133.

The interface control protection film 18 has both of the function of a protection film and the function of an interface control film. It is made of a material having an effect of not exerting a magnetic influence of increasing the magnetostriction on the adjacent soft magnetic free layer 13 or a material having an effect of reducing it. For example, it is preferable that a large amount of a precious metal such as Pt or Ni is contained. On the other hand, by employing a material having a Ni—Cr based composition in which the electric resistivity is increased to 60 $\mu\Omega$cm, the magnetic resistance of the stack film is therefore enhanced and it is necessary to maintain the resistance to a damage such as oxidation. The other functions are almost the same as those in the cases of the structures shown in FIGS. 1, 2, and 3.

Figure 5:
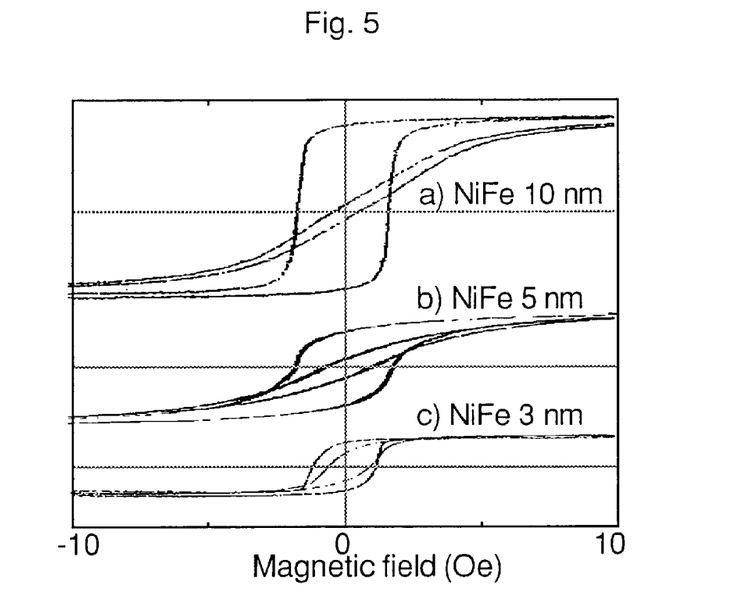
FIG. 5 is a diagram showing a magnetization curve of a soft magnetic free layer using NiFe according to a conventional technique.

FIG. 5 is a diagram showing a thickness dependency of a B—H loop of an NiFe thin film according to a conventional technique. A sample having a structure of substrate/Ta5 nm/Ni-14 wt %Fe(t)/Cu2.5/Ta3, which imitates the Ni alloy layer 133 in the soft magnetic free layer 13 of the spin-valve film is used. When NiFe is 10 nm thick, the hard axis loop has high linearity, an anisotropy field Hk appears clearly, and hard axis coercive force Hch is small. When NiFe becomes thinner, the anisotropy becomes unclear and the hard axis coercive force increases. The difference between the easy axis loop and the hard axis loop is very small when NiFe is 3 nm or less. The conventional technique shows that the magnetic properties deteriorate as the magnetic film becomes thinner.

Figure 6:
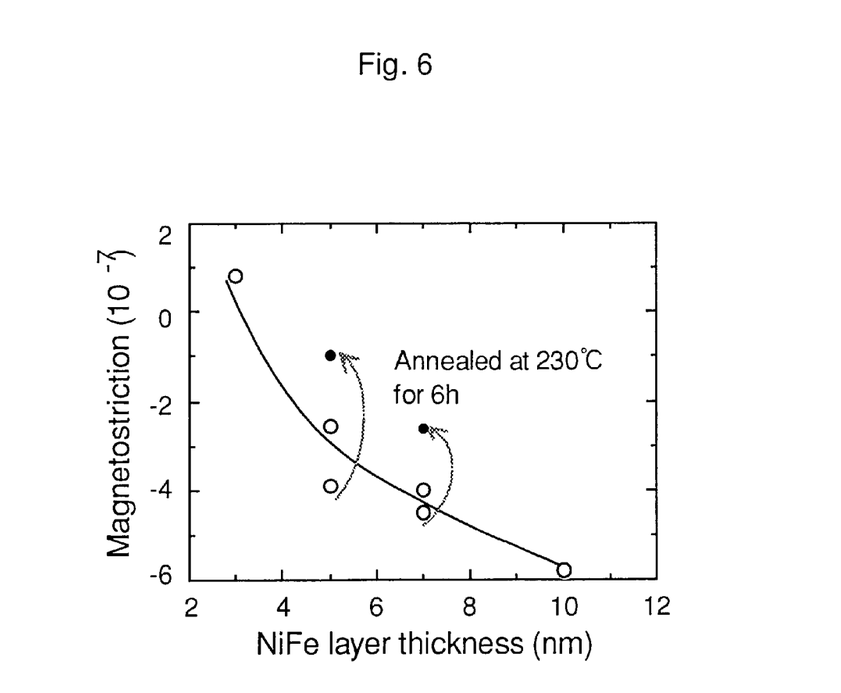
FIG. 6 is a diagram showing the relation between the magnetostriction and the thickness of the soft magnetic free layer using NiFe according to a conventional technique.

FIG. 6 similarly shows the dependency on thickness of the magnetostriction of the Ni-14 wt %Fe film according to the conventional technique. The magnetostriction is inherently a physical amount which is constant with respect to the film thickness. The magnetostriction in a thin film or very thin film according to a conventional technique is, however, largely increased in practice. It is further increased by heat treatment as well. The reason of this can be considered as follows.

When a stacked member of two different kinds of films is examined, the total magnetostriction of the stacked member is expressed by the following equation.

The magnetostriction and the magnetic energy by the magnetostriction are obtained as follows.

$$\Delta Hk \cdot M \cdot t = \Delta Hk1 \cdot M1 \cdot t1 + \Delta Hk2 \cdot M2 \cdot t2$$

$$\lambda i = Hki \cdot Mi/3\sigma i \qquad \text{[Expression 1]}$$

Consequently, when $$\Delta Hki \cdot Mi = \lambda i \cdot 3\sigma i$$

$$\epsilon = \epsilon 1 = \epsilon 2, E = E1 = E2 \qquad \text{[Expression 2]}$$

(all of the films have the same strain and the same Young's modulus), the following is derived.

$$\sigma = \sigma 1 = \sigma 2$$

$$\lambda \cdot t = \lambda 1 \cdot t1 + \lambda 2 \cdot t2 \qquad \text{[Expression 3]}$$

When it is assumed that t to t1>>t2, that is, the film 2 is a contribution of the interface or a reaction layer and is thin with respect to the total film thickness, the following is obtained.

$$\lambda = \lambda 1 \cdot t1/t + \lambda 2 \cdot t2/t \sim \lambda 1 + (\lambda 2 + t2)t \qquad \text{[Expression 4]}$$

That is, the magnetostriction of the stacked member is proportional to the reciprocal of the thickness of the stacked member. Its y intercept corresponds to the magnetostriction at the thickness of a main film.

In the above expressions, λ: magnetostriction, t: film thickness, σ: stress, ε: strain, E: Young's modulus, and Hk: anisotropy field. Suffix 1, suffix 2, and no suffix denote film 1, film 2, and the value of a layered film, respectively.

When a diffusion or mixture layer having a large magnetostriction is formed on the interface of the soft magnetic free layer, the magnetostriction of a thin film is deviated from the value of the thick film in inverse proportional to the thickness of the thin film.

Figure 7:
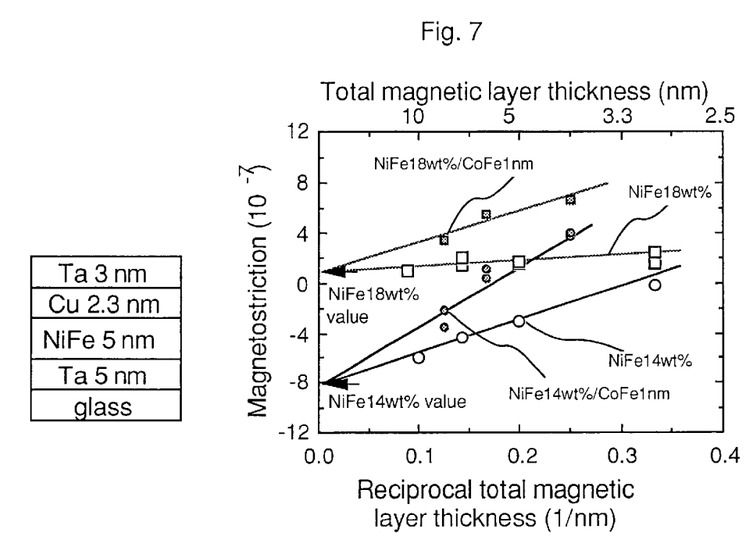
FIG. 7 is a diagram showing the relation between the magnetostriction and the thickness of the soft magnetic free layer using NiFe films and NiFe/CoFe stack films according to the conventional technique.

FIG. 7 is a diagram obtained by plotting the magnetostriction of the NiFe film and NiFe/CoFe film of the conventional technique with the reciprocal of the total magnetic layer thickness. The magnetostriction of the NiFe/CoFe free layer is further increased as compared with that of the NiFe free layer and the inclination with respect to the film thickness also increases. That is, it is understood that the effects of the interface produced by the layered film such as the interface between the NiFe and CoFe films and/or the interface between the CoFe and Cu films contribute to the magnetostriction.

As described above, not only the NiFe interface but also the NiFe/CoFe interface contribute to the magnetostriction of the NiFe/CoFe free layer. As a result, a change in the magnetostriction with respect to the film thickness is large.

As understood from the linear lines of FIG. 7, in the conventional technique, even when the magnetostriction is tried to be maintained at around zero by enriching Ni in the composition of Ni-18 wt %Fe, the magnetostriction of both of the NiFe compositions becomes almost the same positive value when the thickness of the magnetic film is around 1/0.4 to 1/0.3 (2 to 3 nm). That is, it is presumed that the magnetostriction cannot be maintained at around zero by the adjustment of the Ni—Fe composition when the free layer thickness is 3 nm or less. Further, the magnetic properties of the Ni—Fe film of the Ni rich composition tend to gradually deteriorate and the MR ratio of the spin-valve film tends to decrease.

According to the invention, therefore, an insertion layer for interface control is developed for the interface causing a deviation in magnetostriction, especially in the actual examples, for both of the Ta/NiFe interface and the NiFe/CoFe interface. Embodiments will be described hereinbelow along experimental drawings.

Figure 8:
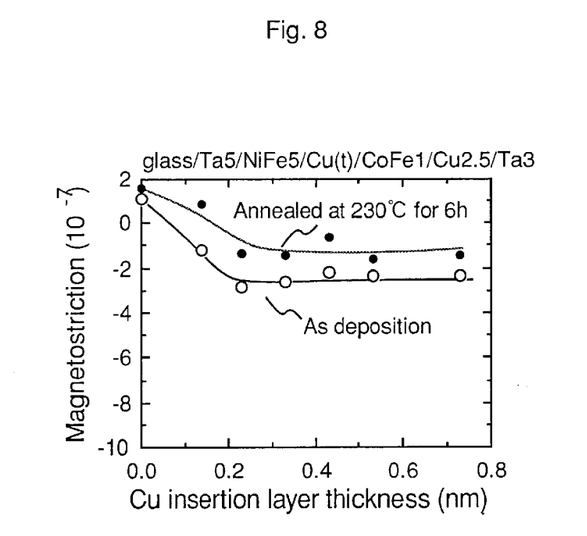
FIG. 8 is a diagram showing the relation between the magnetostriction and the thickness of an interface control layer when the interface control layer of the invention is used as an interface between the NiFe layer and the CoFe layer in the soft magnetic free layer.

FIG. 8 is a diagram showing the value of the magnetostriction when a Cu insertion layer is inserted. In association with the insertion of the Cu layer, the value of magnetostriction decreases and becomes almost constant when the thickness is 0.2 nm or more. After heat treatment, the magnetostriction slightly increases. An effect of reduction of $4 \times 10^{-7}$ is produced without performing heat treatment. The value is almost equal to the difference between the NiFe/CoFe free layer and the NiFe free layer (when the thickness of the magnetic layer is 6 nm) in FIG. 5. It is therefore estimated that the difference of magnetostriction between the NiFe free layer and the NiFe/CoFe free layer is not due to an influence of the CoFe/Cu interface so much but is mostly due to the NiFe/CoFe interface.

Figure 9:
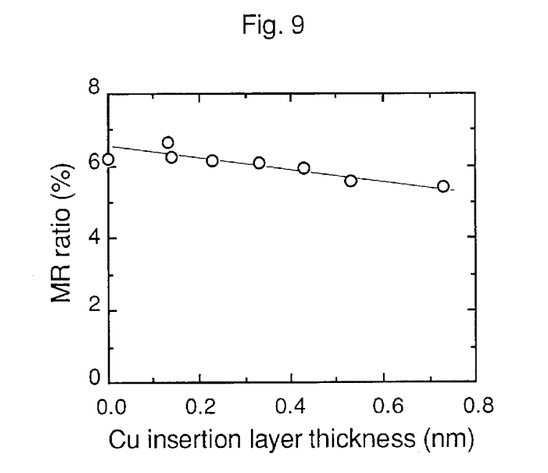
FIG. 9 is a diagram showing the relation between the thickness and the MR ratio of the Cu interface control layer.
Figure 10:
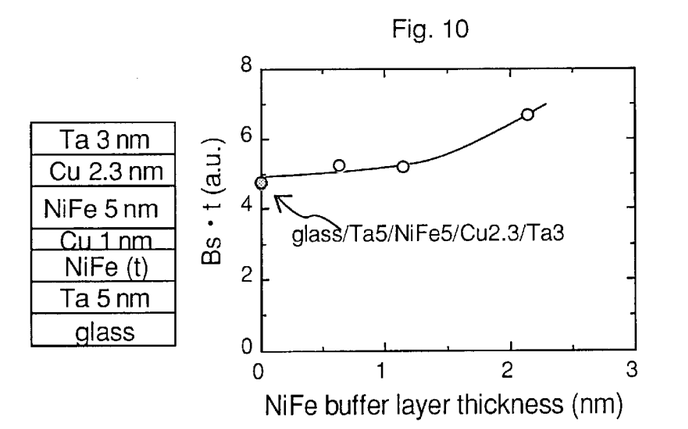
FIG. 10 is a diagram showing the relation between the thickness and the magnetization amount of the NiFe underlayer.

FIG. 9 is a diagram showing the MR ratio of a spin-valve film in which a Cu insertion layer is inserted between 5 nm of an NiFe free layer and 1 nm of a CoFe free layer. When the Cu insertion layer is thick, the MR ratio decreases slightly. As compared with FIG. 8, however, it is understood that the magnetostriction suppressing effect is obtained almost without decreasing the MR ratio when the thickness is about 0.2 to 0.5 nm. FIG. 10 is a diagram showing an interlayer coupling magnetic field in a similar manner. It is considered that even when the Cu insertion layer is inserted, the interlayer coupling magnetic field rather slightly decreases and there is no problem with respect to the properties. Although not shown, no adverse influence such that magnetic separation of the free layers or increase in coercive force by the Cu insertion layer of 1 nm or less by measurement of a magnetoresistive curve was recognized.

The interface between a soft magnetic free layer and an underlayer (protection film) such as Ta and NiFe will now be described. Table 1 shows the result of fabricating the spin-valve film while changing the composition of the underlayer.

TABLE 1

Composition of underlayer and effects

| Composition of underlayer | Reduction in magnetostriction | Magnetic properties | MR ratio |
|---|---|---|---|
| glass/SV | | | decreased after heat treatment |
| glass/Ru1-2/SV | excellent | excellent | decreased after heat treatment |
| glass/Ta5/Ru1-2/SV | little | | |
| glass/Ta5/Cu1/SV | | Hint increase | |
| glass/Ta5/NiFe0.5-2/Cu0.5-2/SV | excellent | excellent | rather decreased |
| glass/Ta5/NiFe0.5-2/Ru0.5-2/SV | good | excellent | rather decreased |

(SV in the table denotes NiFe5/CoFe1/Cu2.3/Co3/CrMnPt30/Ta3)

In the compositions of glass/SV and glass/Ru/SV, the MR ratio after heat treatment decreased. The cause is considered that since a Ta underlayer film is eliminated, the orientation of the spin-valve film deteriorates and heat stability is lowered. In the compositions of glass/Ta/Ru/SV and glass/Ta/Cu/SV, the effect on reduction of the magnetostriction is a little. In the case where the underlayer is made of Cu, an interlayer coupling magnetic field Hint increased about 50 e.

The case of using the NiFe underlayer of about 1 nm and the insertion layer (hereinbelow, called a barrier layer) made of Cu or Ru showed the most preferable result. Description will be given hereinbelow with respect to the result.

FIG. 10 is a diagram showing the relation between the thickness of the NiFe underlayer using a barrier layer made of Cu having a thickness of 1 nm and the magnetization amount of the free layer. As compared with a standard film having no underlayer, the magnetizing amount is hardly seen in the samples having the NiFe underlayer of 1.1 nm or less. It is therefore assumed that the NiFe underlayer of 1.1 nm or less is mixed with the Ta film to thereby dissipate the magnetization and that the Cu barrier layer is mixed with the interface of the upper neighboring NiFe layer to thereby reduce the magnetization by about 1 nm·T.

It is therefore assumed that the Cu layer is mixed with the NiFe layer. Although the Cu layer is called a "barrier layer", it cannot be said that the Cu layer can suppress diffusion of the NiFe layer in practice. It is important that the NiFe layer is mixed with not Ta whose magnetostriction to the positive side is large but Cu. The selection of the "barrier layer" should be determined by the magnetic properties and the effect on the magnetostriction at the time of mixture with the NiFe film.

Figure 11:
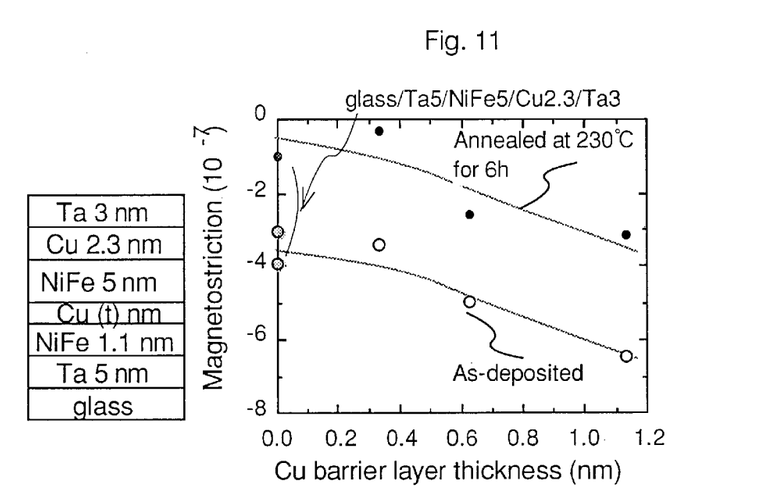
FIG. 11 is a diagram showing the relation between the thickness of a Cu barrier layer of the invention and the magnetostriction of the soft magnetic free layer.

FIG. 11 shows the relation between the thickness of the Cu barrier layer and the magnetostriction when the thickness of the Ni-14 wt %Fe underlayer is fixed to 1.1 nm. As the Cu layer becomes thicker, the magnetostriction is reduced. Consequently, it is understood that the Cu layer is effective on suppressing the magnetostriction. After the heat treatment, however, the magnetostriction increases in all of the samples. It is therefore desirable to select a material which suppresses the magnetostriction more effectively.

Figure 12:
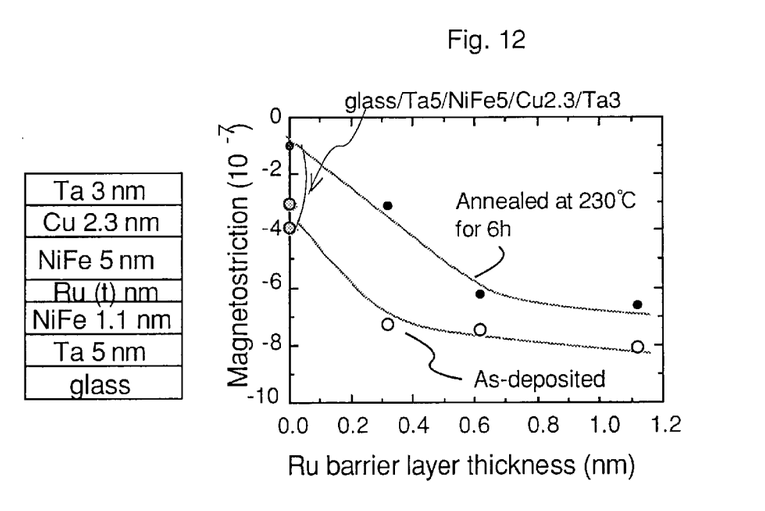
FIG. 12 is a diagram showing the relation between the thickness of an Ru barrier layer of the invention and the magnetostriction of the soft magnetic free layer.

FIG. 12 is a diagram showing the magnetostriction of the free layer using an Ru barrier layer. In samples containing Ru of 0.6 nm or thicker, the value of magnetostriction is reduced much more as compared with samples having no barrier layer. The value is close to that of the inherent NiFe film. It can be considered that the result is obtained by the following reasons that Ru is a high-melting temperature metal, easily forms a continuous film even when the layer is thin, and is very effective on suppressing the magnetostriction, and addition of a noble metal to NiFe has the effect of reducing the magnetostriction of the NiFe film.

Figure 13:
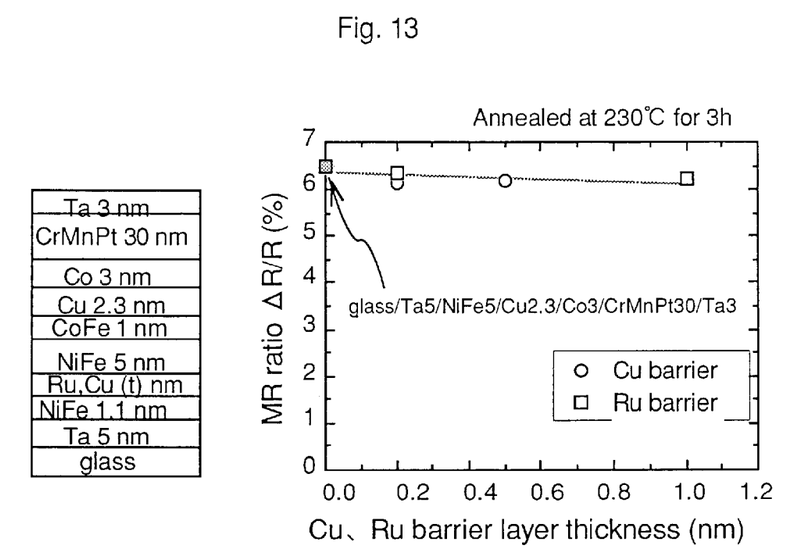
FIG. 13 is a diagram showing the relation between the thickness of Cu and Ru barrier layers of the invention and the MR ratio.

FIG. 13 is a diagram showing the MR ratio of the spin-valve film using Cu and Ru barrier layers. Although the MR ratio slightly decreases in both of the Cu barrier layer and the Ru barrier layer, the ratio is about 0.5% which is not a problem.

As described above, by using the spin-valve film having the structure of the NiFe film of about 1 nm on the underlayer/Ru (Cu)/soft magnetic free layer/nonmagnetic intermediate layer/ferromagnetic pinned layer/ antiferromagnetic film, the magnetoresistive stack film preventing increase in the magnetostriction, maintaining the magnetic properties of the very thin soft magnetic free layer preferable, and having high reproduction sensitivity can be realized.

A structure of about 1 nm of NiFe film and an Ru (Cu) layer is examined here. It is understood that the structure has the function of the interface control layer which prevents increase in the magnetostriction by being in contact with the NiFe film which displays orientation on the underlayer and the soft magnetic free layer. Further, effects similar to those achieved by the structure of two layers can be produced by the single-layer film.

Figure 14:
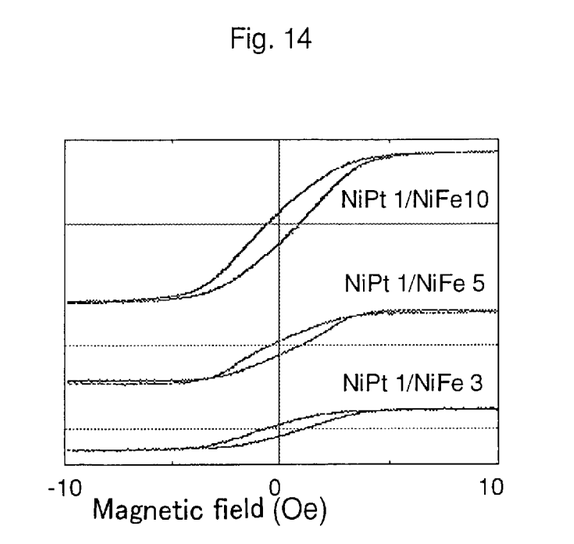
FIG. 14 is a diagram showing the magnetization curve of a soft magnetic free layer using an Ni—Pt interface control layer of the invention.

FIG. 14 is a diagram showing the B—H loop of a film having the structure of substrate/5 nm of Ta/1 nm of Ni-30 at %Pt/10, 5, or 3 nm of Ni-18 wt %Fe/2.3 nm of Cu/and 3 nm of Ta. As compared with the loops of the same thickness in FIG. 5, it is understood that the magnetization curve of the NiFe film to which the Ni—Pt interface control layer is applied shows that the properties are clearly improved. Specifically, the anisotropy field increases and the hard axis coercive force does not increase but is almost constant with respect to the NiFe film thickness.

Figure 15:
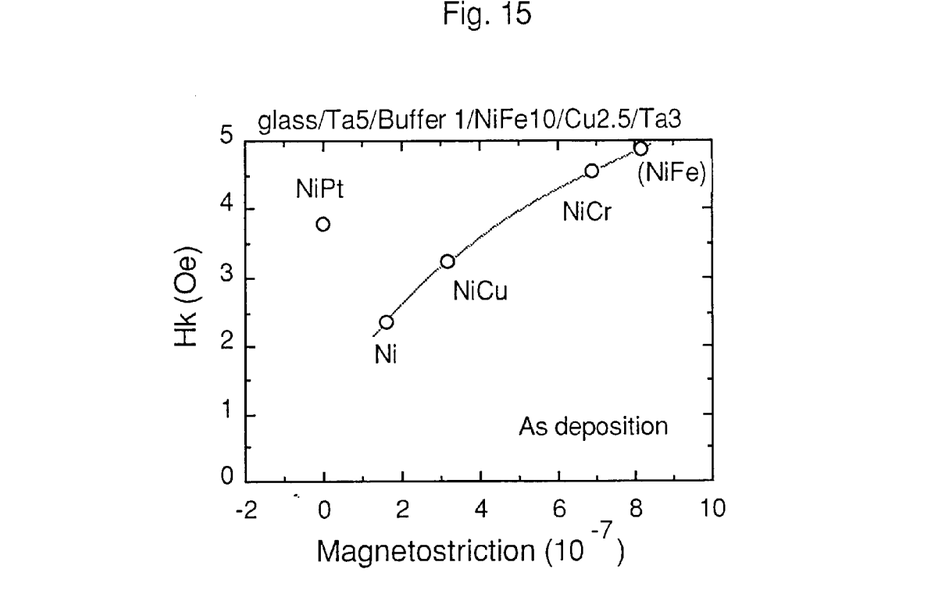
FIG. 15 is a diagram showing magnetic properties of a soft magnetic free layer using the interface control layer of the invention.

FIG. 15 is a diagram showing the properties of 10 nm of the NiFe film using the interface control layer made of each of various Ni alloys. The compositions of the interface control layer are Ni-30 at %Cr, Ni-30 at %Cu, pure Ni, and Ni-30 at %Pt. The value of "NiFe" is a standard value when the interface control layer of the invention is not used. It is understood that the magnetostriction of all of the films each using the interface control layer is reduced. Especially, the magnetostriction in the interface control layer of Ni—Pt is almost zero and the anisotropy field Hk is about 4 oersted. Preferable magnetic properties are obtained.

Figure 16:
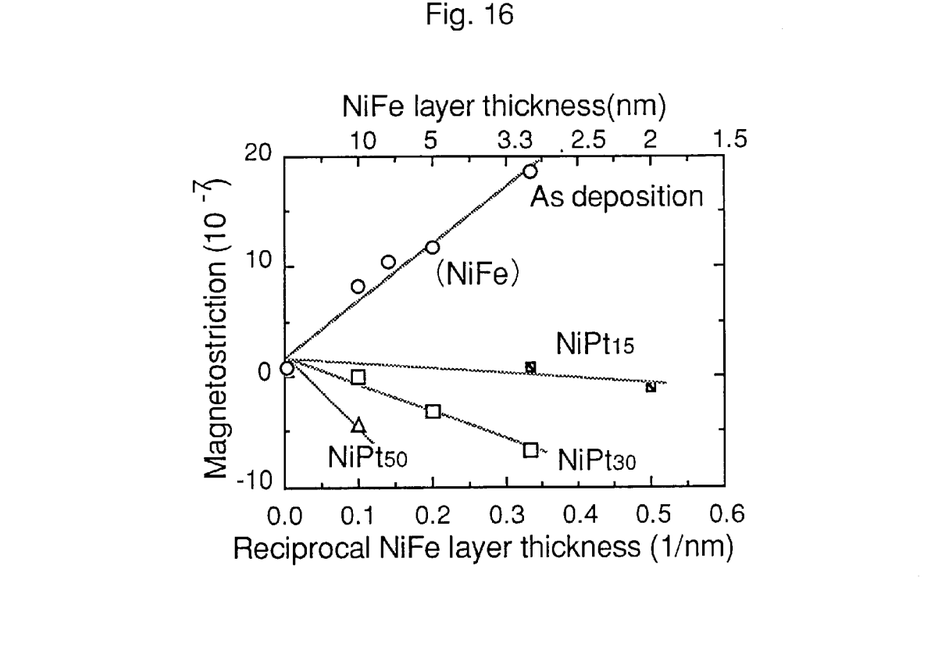
FIG. 16 is a diagram showing the relation between the thickness of the soft magnetic free layer and the magnetostriction when the composition of the Ni—Pt interface control layer of the invention is varied.

FIG. 16 is a diagram showing the relation between the thickness of the Ni—Fe film (represented by the reciprocal of the thickness) in the case of the interface control layer whose Ni—Pt composition is varied and the magnetostriction. Although the value indicated by NiFe of the conventional technique using no interface control layer has a large inclination with respect to the thickness, the inclination of the value in the case of using the Ni—Pt interface control layer can be changed. Especially, Ni-15 at %Pt can obtain a constant value with respect to the thickness of the NiFe layer.

Figure 17:
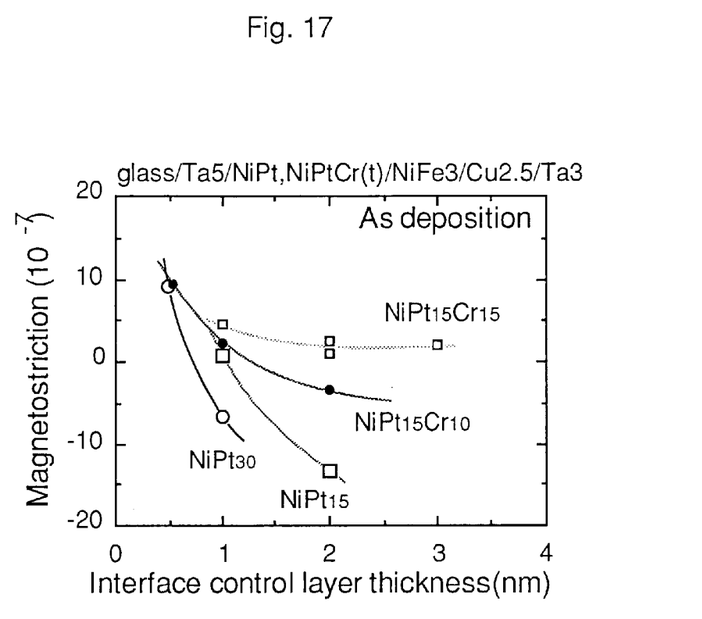
FIG. 17 is a diagram showing the magnetostriction of the soft magnetic free layer when the thickness of the interface control layer of the invention is varied.

FIG. 17 is a diagram showing the relation between the thickness of the interface control layer and the magnetostriction when the thickness of the Ni—Fe layer is fixed to 3 nm. When the composition of the interface control layer is changed, the value of magnetostriction can be adjusted. On the other hand, by changing the thickness of the interface control layer, the value of magnetostriction can be also changed. On the contrary, even when the thickness of the interface control film is increased to 2 to 3 nm, the current loss is not caused by using the interface control film having a high electric resistivity such as Ni—Pt—Cr. Thus, the stability against a change in film thickness can be increased like the Ni-30 at %Pt-15%Cu interface control layer whose magnetostriction does not change according to the thickness of the interface control layer.

Figure 18:
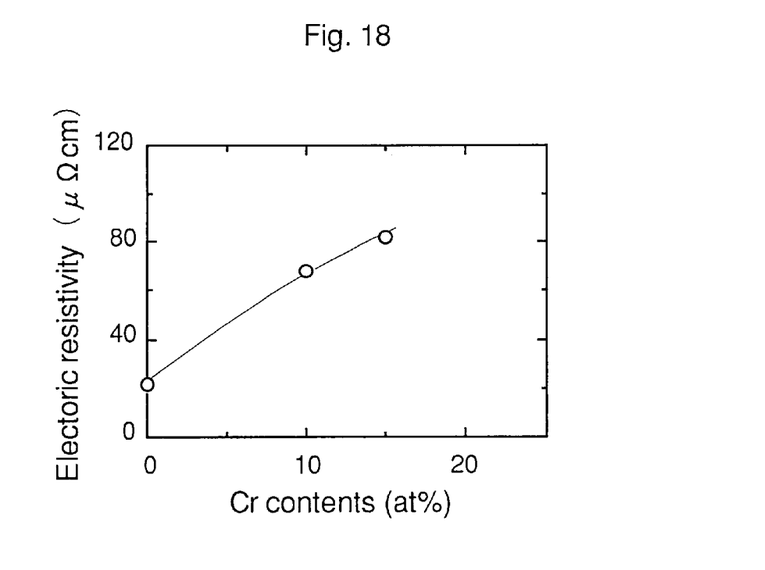
FIG. 18 is a diagram showing the electric resistivity of the interface control layer when the Cr composition of the interface control layer of the invention is varied.

FIG. 18 is a diagram showing the relation between the electric resistivity of the Ni—Pt—Cr film and the Cr contents. When Cr is added, the electric resistivity can be raised to about 20 to 100 $\mu\Omega$cm, so that the MR ratio can be improved.

Figure 19:
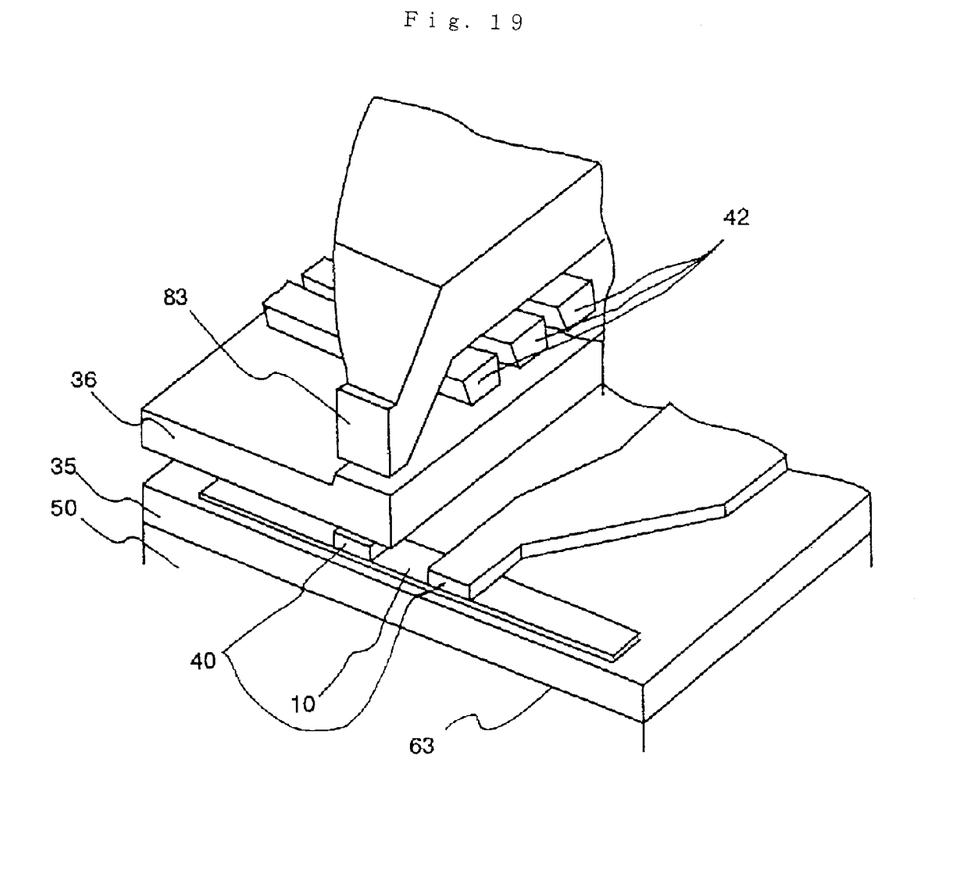
FIG. 19 is a conceptual perspective view of a recording and reproduction separated head using a magnetoresistive layered film of the invention.

FIG. 19 is a conceptual diagram of a magnetic head on which a magnetic sensor made by the magnetoresistive device of the invention is mounted. On the substrate 50, the magnetoresistive stack film 10, electrodes 40, a lower shield 35, an upper shield and lower core 36, a reproduction gap 37, a coil 42, and an upper core 83 are formed and an air-bearing surface 63 is formed.

Figure 20:
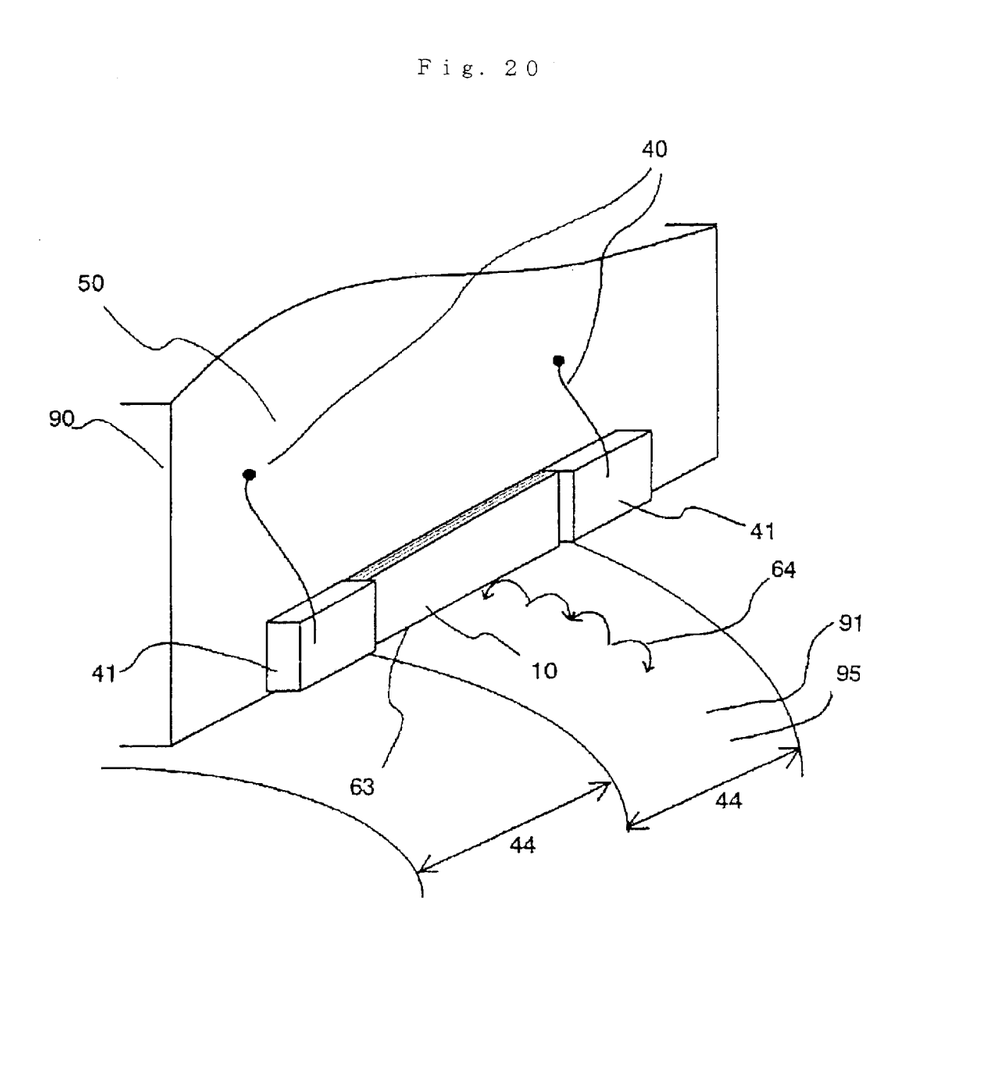
FIG. 20 is a conceptual perspective view of a magnetic recording and reproducing device using a magnetic sensor of the invention.

FIG. 20 is a conceptual diagram of a magnetic recording and reproducing device using the magnetic head of the invention. The magnetoresistive stack film 10, a magnetic domain control film 41, and electrodes 40 are formed on the substrate 50 also serving as a head slider 90, thereby forming a magnetic head. By positioning the magnetic head above a recording track 44 on a disk 95 having a recording medium 91, reproduction is performed. The head slider 90 moves relative to the disk 95 with the air-bearing surface 63 facing the disk 95 on or above at the height of 0.1 micron or less. By the mechanism, the magnetoresistive stack film 10 can read a magnetic signal recorded on the recording medium 91 on the disk 95 from a leakage magnetic field 94 of the recording medium 91.

Figure 21:
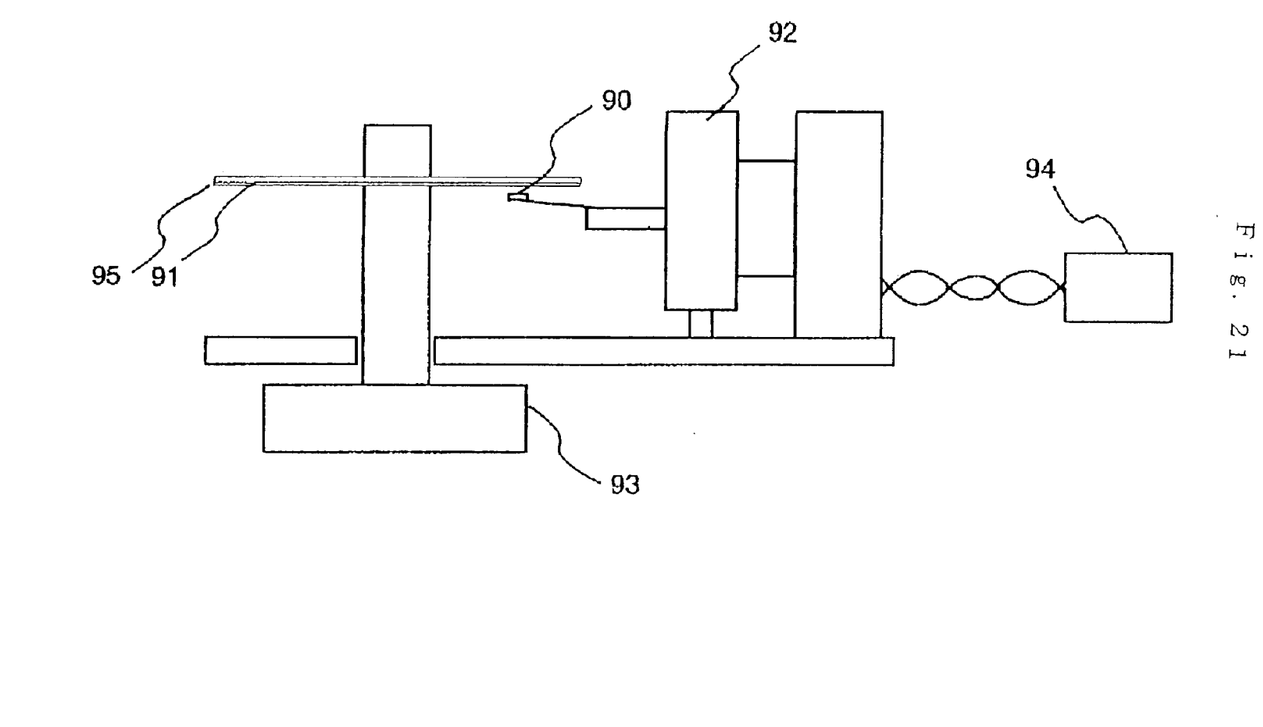
FIG. 21 is a diagram showing a configuration example of the magnetic recording and reproducing device using the magnetic sensor of the invention.

FIG. 21 shows an example of the configuration of the magnetic recording and reproducing device of the invention. The disk 95 carrying the recording medium 91 which magnetically records information is rotated by a spindle motor 93 and the head slider 90 is led above a track of the disk 95 by an actuator 92. That is, in the magnetic disk device, a reproduction head and a recording head formed on the head slider 90 are relatively moved close to a predetermined recording position on the disk 95 by the mechanism and sequentially write and read signals.

A rotary actuator is preferable as the actuator 92. A recording signal is recorded on a medium by the recording head via a signal processing system 94 and an output of the reproduction head is obtained as a signal through the signal processing system 94. Further, at the time of moving the reproduction head above a desired recording track, by detecting the position above the track by using a high-sensitivity output from the reproduction head and controlling the actuator, the head slider can be positioned.

Although one head slider 90 and one disk 95 are shown in the diagram, a plurality of head sliders 90 and a plurality of disks 95 may be also used. The disk 95 can record information by having a recording medium on both sides. When information is recorded on both sides of the disk, the head sliders 90 are disposed for both sides of the disk.

The magnetic head of the invention and the magnetic recording and reproducing device on which the magnetic head is mounted with the construction as mentioned above were tested. A sufficient output and a preferable bias characteristic were presented and the reliability of the operation was also preferable.

As described in detail above, according to the invention, the magnetic sensor which has preferable magnetic properties and is stable especially against an influence of stress can be provided. Moreover, the magnetic head having a preferable reproduction output and stability at high recording density and the high-density magnetic recording and reproducing device can be obtained.

What is claimed is:

1. A magnetic sensor comprising a spin-valve film or tunnel junction film having a layered structure of a soft magnetic free layer, a nonmagnetic intermediate layer, and a ferromagnetic pinned layer, wherein the magnetization of the ferromagnetic pinned layer is pinned with respect to a magnetic field to be sensed, the magnetization of the soft magnetic free layer rotates according to an external magnetic field, and a relative angle between the magnetization of the soft magnetic free layer and the magnetization of the ferromagnetic pinned layer is changed, thereby causing magnetoresistance, the soft magnetic free layer has a structure of an Ni alloy layer, an interface control layer, and a Co alloy layer, the Ni alloy layer is made of 70 to 90 at % of nickel and the balance of iron, or 0.1 to 20 at % of cobalt and, in the balance, 70 to 90% of nickel and 10 to 30% of iron, the Co alloy layer is made of pure Co, 50 to 99 at % of cobalt and the balance of iron, or 40 to 99 at % of cobalt, 1 to 30 at % of nickel, and 1 to 30% of iron, and the interface control layer is made of Cu, Au, Ru, Ag, Pt, Pd, Ir, Rh, Re, Os, or an alloy of any of them and has a thickness of 1 nanometer or less.

2. A magnetic sensor comprising a layered structure of a nonmagnetic layer as an underlayer, an interface control layer, a soft magnetic free layer, a nonmagnetic intermediate layer, and a ferromagnetic pinned layer, wherein the magnetization of the ferromagnetic pinned layer is pinned with respect to an external magnetic field, the magnetization of the soft magnetic free layer rotates according to the external magnetic field, a relative angle between the magnetization of the soft magnetic free layer and the magnetization of the ferromagnetic pinned layer is changed, thereby causing magnetoresistance, and the interface control layer is either an Ni layer, an X layer, an M—X layer, an Ni—X layer, or an Ni—X—Cr layer (M=Ta, Nb, Hf, Ti, or Mo, X=Cu, Au, Ru, Ag, Pt, Pd, Ir, Rh, Re, or Os).

3. A magnetic sensor according to claim 2, wherein the interface control layer is provided directly on the nonmagnetic layer.

* * * * *